(12) United States Patent
Park et al.

(10) Patent No.: US 10,534,704 B2
(45) Date of Patent: Jan. 14, 2020

(54) CONTROLLER, MEMORY SYSTEM AND OPERATING METHOD THEREOF

(71) Applicant: SK hynix Inc., Gyeonggi-do (KR)

(72) Inventors: Byeong-Gyu Park, Gyeonggi-do (KR); Kyu-Min Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 166 days.

(21) Appl. No.: 15/636,716

(22) Filed: Jun. 29, 2017

(65) Prior Publication Data

US 2018/0143899 A1 May 24, 2018

(30) Foreign Application Priority Data

Nov. 24, 2016 (KR) ........................ 10-2016-0157116

(51) Int. Cl.
| | | |
|---|---|---|
| *G06F 12/02* | (2006.01) | |
| *G06F 11/10* | (2006.01) | |
| *G06F 13/14* | (2006.01) | |
| *G06F 13/16* | (2006.01) | |
| *G11C 11/56* | (2006.01) | |
| *G11C 29/52* | (2006.01) | |

(52) U.S. Cl.
CPC ...... *G06F 12/0246* (2013.01); *G06F 11/1012* (2013.01); *G06F 13/14* (2013.01); *G06F 13/1673* (2013.01); *G11C 11/5642* (2013.01); *G11C 29/52* (2013.01)

(58) Field of Classification Search
CPC .. G06F 12/0246; G06F 12/02; G06F 11/1012; G06F 11/10; G06F 11/1048; G06F 3/0674; G06F 3/06; G06F 3/0608; G06F 3/0676; G06F 3/064; G06F 13/14; G06F 13/16; G06F 13/1676; G11C 11/56; G11C 11/5642; G11C 29/52; H03M 13/2915; H03M 13/6356; H04L 1/0045; H04L 1/0071; H04L 1/0057; H04L 1/1819
USPC ........................................................ 711/100
See application file for complete search history.

(56) References Cited

U.S. PATENT DOCUMENTS

| | | | | |
|---|---|---|---|---|
| 4,800,520 | A * | 1/1989 | Iijima .................. | G06Q 20/341 |
| 5,596,564 | A * | 1/1997 | Fukushima ........ | G11B 20/1254 360/39 |
| 6,061,820 | A * | 5/2000 | Nakakita ........... | H03M 13/2915 370/395.65 |

(Continued)

FOREIGN PATENT DOCUMENTS

| | | |
|---|---|---|
| KR | 100904518 | 6/2009 |
| KR | 1020130016941 | 2/2013 |

*Primary Examiner* — Shawn X Gu
*Assistant Examiner* — Jean C Edouard
(74) *Attorney, Agent, or Firm* — IP & T Group LLP

(57) ABSTRACT

A controller includes a memory suitable for storing valid data of first data in a first data region and storing second data in a second data region, wherein the first data includes the valid data and dummy data; a translation unit suitable for performing a first translation operation of changing the first data to the valid data by eliminating the dummy data from the first data, performing a second translation operation of changing the valid data to the first data by adding the dummy data to the valid data, and exchanging the valid data with the memory; and a processor suitable for exchanging the first data with the translation unit, and exchanging the second data with the memory.

18 Claims, 9 Drawing Sheets

(56) References Cited

U.S. PATENT DOCUMENTS

| | | | | |
|---|---|---|---|---|
| 6,490,264 | B1* | 12/2002 | Suzuki | H04Q 11/0478 |
| | | | | 370/338 |
| 9,372,741 | B2* | 6/2016 | Um | G06F 11/0706 |
| 2001/0034809 | A1* | 10/2001 | Ogawa | G06F 12/023 |
| | | | | 711/103 |
| 2007/0008797 | A1* | 1/2007 | Park | G11C 5/066 |
| | | | | 365/219 |
| 2008/0123490 | A1* | 5/2008 | Ogawa | G11B 20/00115 |
| | | | | 369/52.1 |
| 2009/0241010 | A1* | 9/2009 | Yano | G06F 11/1072 |
| | | | | 714/764 |
| 2012/0159058 | A1* | 6/2012 | Yonezawa | G11C 11/5628 |
| | | | | 711/104 |
| 2013/0198438 | A1* | 8/2013 | Masuo | G06F 12/0246 |
| | | | | 711/103 |
| 2014/0289493 | A1* | 9/2014 | Kobayashi | G06F 12/0223 |
| | | | | 711/171 |
| 2016/0266814 | A1* | 9/2016 | Shimokawa | G06F 3/0608 |

* cited by examiner

CONTROLLER, MEMORY SYSTEM AND OPERATING METHOD THEREOF

CROSS-REFERENCE TO RELATED APPLICATION

This U.S. non-provisional patent application claims priority under 35 U.S.C. § 119(a) to Korean Patent Application No. 10-2016-0157116 filed on Nov. 24, 2016 in the Korean Intellectual Property Office (KIPO), the disclosure of which is incorporated herein by reference in its entirety.

TECHNICAL FIELD

Exemplary embodiments relate to a memory system, and more particularly, to a memory system for processing data to and from a memory device, and an operating method thereof.

DISCUSSION OF THE RELATED ART

The computer environment paradigm has changed to ubiquitous computing systems that can be used anytime and anywhere. Due to this fact, use of portable electronic devices such as mobile phones, digital cameras, and notebook computers has rapidly increased. These portable electronic devices generally use a memory system having one or more memory devices for storing data. A memory system may be used as a main memory device or an auxiliary memory device of a portable electronic device.

Memory systems provide excellent stability, durability, high information access speed, and low power consumption since they have no moving parts. Examples of memory systems having such advantages include universal serial bus (USB) memory devices, memory cards having various interfaces, and solid state drives (SSD).

SUMMARY

Various embodiments are directed to a controller and an operating method thereof, capable of minimizing complexity and performance deterioration of a memory system and maximizing use efficiency of a memory device, thereby quickly and stably processing data with respect to the memory device.

In an exemplary embodiment of the present invention, a controller for a memory system, the controller may include: a memory suitable for storing valid data of first data in a first data region and storing second data in a second data region, wherein the first data includes the valid data and dummy data; a translation unit suitable for performing a first translation operation of changing the first data to the valid data by eliminating the dummy data from the first data, performing a second translation operation of changing the valid data to the first data by adding the dummy data to the valid data, and exchanging the valid data with the memory; and a processor suitable for exchanging the first data with the translation unit, and exchanging the second data with the memory.

Preferably, the translation unit may perform the first translation operation to the first data received from the processor, and may store the valid data, which is changed by the first translation operation, in the memory.

Preferably, the processor may provide the translation unit with a write request including length information of the valid data and the first data, and the translation unit may perform the first translation operation to the first data included in the write request based on the length information of the valid data.

Preferably, the write request may further include entry information, and the translation unit may store the valid data, which is changed by the first translation operation, in the memory based on the entry information.

Preferably, the entry information may include a start address of the first data region and location of entry in the first data region.

Preferably, the translation unit may perform the second translation operation to the valid data read from the memory, and may provide the processor with the first data, which is changed by the second translation operation.

Preferably, the processor may provide the translation unit with a read request including entry information and length information of the valid data, and the translation unit may read the valid data corresponding to the read request based on the entry information, and may perform the second translation operation to the read valid data.

Preferably, the entry information may include a start address of the first data region and location of entry in the first data region.

Preferably, the first data may be meta-data, and the second data may be user data.

Preferably, the meta-data may represent mapping relationship between logical address and physical address of the user data.

In an exemplary embodiment of the present invention, an operation method of a controller for a memory system, the method may include: performing, by the translation unit, a first translation operation of changing first data, which include valid data and dummy data and is provided from a processor, to the valid data by eliminating the dummy data from the first data; storing, by the translation unit, the valid data in a first data region of a memory; performing, by the translation unit, a second translation operation of changing the valid data, which is read from the first data region of the memory, to the first data by adding the dummy data to the valid data; and providing, by the translation unit, the first data to the processor.

Preferably, the performing of the first translation operation may include: providing, by the processor, the translation unit with a write request including length information of the valid data and the first data; and performing, by the translation unit, the first translation operation to the first data included in the write request based on the length information of the valid data.

Preferably, the write request may further include entry information, and the storing of the valid data includes storing, by the translation unit, the valid data, which is changed by the first translation operation, in the first data region of the memory based on the entry information.

Preferably, the entry information may include a start address of the first data region and location of entry in the first data region.

Preferably, the performing of the second translation operation may include: providing, by the processor, the translation unit with a read request including entry information and length information of the valid data; reading, by the translation unit, the valid data corresponding to the read request from the first data region of the memory based on the entry information; and performing, by the translation unit, the second translation operation to the read valid data.

Preferably, the entry information may include a start address of the first data region and location of entry in the first data region.

Preferably, the operation method may further comprise storing, by the processor, second data in a second data region of the memory.

Preferably, the first data may be meta-data, and the second data may be user data.

Preferably, the meta-data may represent mapping relationship between logical address and physical address of the user data.

Preferably, the meta-data may represent information of grouping memory blocks, which can be simultaneously selected among memory blocks.

In accordance with various embodiments of the present invention, data stored in memory cells of a semiconductor memory device may be precisely read.

BRIEF DESCRIPTION OF THE DRAWINGS

These and other features and advantages of the present invention will become apparent to those skilled in the art to which the present invention pertains from the following detailed description in reference to the accompanying drawings, in which.

DETAILED DESCRIPTION

Figure 1:
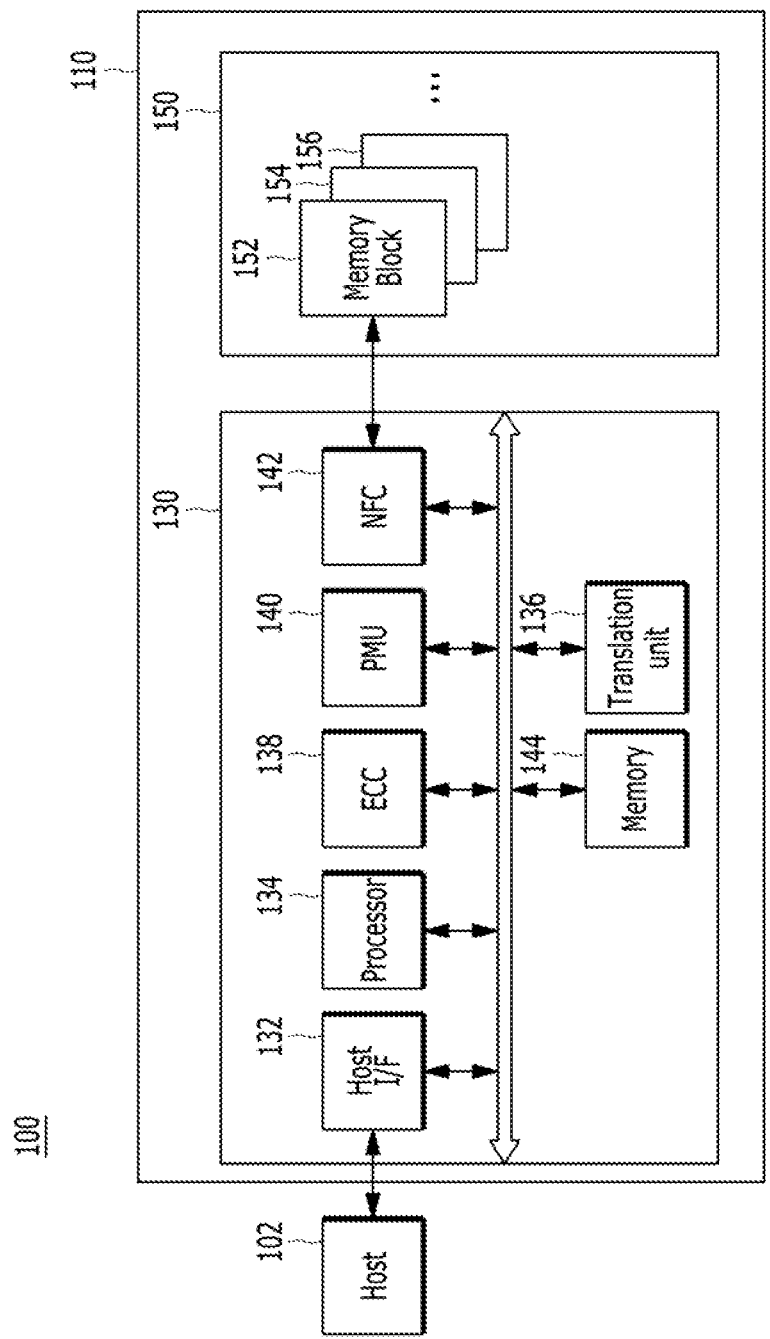
FIG. 1 is a block diagram illustrating a data processing system in accordance with an embodiment of the present invention.

Various embodiments of the present invention are described below in more detail with reference to the accompanying drawings. We note, however, that the present invention may be embodied in different other embodiments, forms and variations thereof and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

FIG. 1 is a block diagram illustrating a data processing system 100 in accordance with an embodiment of the present invention.

Referring to FIG. 1, the data processing system 100 may include a host 102 and the memory system 110.

The host 102 may be any suitable electronic device including portable electronic devices such as a mobile phone, an MP3 player and a laptop computer or non-portable electronic devices such as a desktop computer, a game machine, a TV and a projector.

The host 102 may include at least one OS (operating system). The OS may manage and control the various functions and operations of the host 102, and provide an operation between the host 102 and a user using the data processing system 100 or the memory system 110. The OS may support functions and operations corresponding to the use purpose and usage of a user. For example, the OS may include a general OS and a mobile OS, depending on the mobility of the host 102. The general OS may include a personal OS and an enterprise OS, depending on the environment of a user. For example, the personal OS may be configured to support a function providing a service to general users and may include Windows and Chrome, and the enterprise OS may be configured to secure and support high performance and may include Windows server, Linux and Unix. Furthermore, the mobile OS may include Android, IOS and Windows Mobile. The host 102 may include a plurality of OSs, and execute an OS to perform an operation corresponding to a user's request on the memory system 110. The memory system 110 may operate to store data for the host 102 in response to a request of the host 102. Non-limited examples of the memory system 110 may include a solid-state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC) and micro-MMC. The SD card may include a mini-SD card and micro-SD card.

The memory system 110 may be embodied by various types of storage devices. Non-limiting examples of storage devices included in the memory system 110 may include volatile memory devices such as a DRAM dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM) and a flash memory. The flash memory may have a 3-dimensional (3D) stack structure.

The memory system 110 may include a memory device 150 and a controller 130. The memory device 150 may store data for the host 120, and the controller 130 may control data storage into the memory device 150.

The controller 130 and the memory device 150 may be integrated into a single semiconductor device, which may be included in the various types of memory systems as exemplified above. For example, the controller 130 and the memory device 150 may be integrated as one semiconductor device to constitute an SSD. When the memory system 110 is used as an SSD, the operating speed of the host 102 connected to the memory system 110 can be improved. In addition, the controller 130 and the memory device 150 may be integrated as one semiconductor device to constitute a memory card. For example, the controller 130 and the memory device 150 may constitute a memory card such as a PCMCIA (personal computer memory card international association) card, CF card, SMC (smart media card), memory stick, MMC including RS-MMC and micro-MMC, SD card including mini-SD, micro-SD and SDHC, or UFS device.

Non-limiting application examples of the memory system 110 may include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain data stored therein even when power is not supplied. The memory device 150 may store data provided from the host 102 through a write operation, and provide data stored therein to the host 102 through a read operation. The memory device 150 may include a plurality of memory dies (not shown), each memory die including a plurality of planes (not shown), each plane including a plurality of memory blocks 152 to 156. Each of the memory blocks 152 to 156 may include a plurality of pages, and each of the pages may include a plurality of memory cells coupled to a word line.

The controller 130 may control the memory device 150 in response to a request from the host 102. The controller 130 may control read, write, program and erase operations of the memory device 150. For example, the controller 130 may provide data read from the memory device 150 to the host 102, and store data provided from the host 102 into the memory device 150.

The controller 130 may include a host interface (I/F) unit 132, a processor 134, an error correction code (ECC) unit 138, a Power Management Unit (PMU) 140, a memory device controller such as a NAND flash controller (NFC) 142 and a memory 144 all operatively coupled via an internal bus.

The host interface unit 132 may be configured to process a command and data of the host 102, and may communicate with the host 102 through one or more of various interface protocols such as universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (PATA), enhanced small disk interface (ESDI) and integrated drive electronics (IDE).

The ECC unit 138 may detect and correct an error contained in the data read from the memory device 150. In other words, the ECC unit 138 may perform an error correction decoding process to the data read from the memory device 150 through an ECC code used during an ECC encoding process. According to a result of the error correction decoding process, the ECC unit 138 may output a signal, for example, an error correction success/fail signal. When the number of error bits is more than a threshold value of correctable error bits, the ECC unit 138 may not correct the error bits, and may output an error correction fail signal.

The ECC unit 138 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, the ECC unit 138 is not limited thereto. The ECC unit 138 may include all circuits, modules, systems or devices for error correction.

The PMU 140 may provide and manage the power required by the controller 130.

The memory device controller 142 may serve as a memory/storage interface for interfacing the controller 130 and the memory device 150 such that the controller 130 controls the memory device 150 in response to a request from the host 102. When the memory device 150 is a flash memory or specifically a NAND flash memory, the memory device controller 142 may be a NAND flash controller NFC. The memory device controller 142 may generate a control signal for the memory device 150 and process data to be provided to the memory device 150 under the control of the processor 134. The memory device controller 142 may work as an interface (e.g., a NAND flash interface) for processing a command and data between the controller 130 and the memory device 150. Specifically, the memory device controller 142 may support data transfer between the controller 130 and the memory device 150.

The memory 144 may serve as a working memory of the memory system 110 and the controller 130, and store data for driving the memory system 110 and the controller 130. The controller 130 may control the memory device 150 to perform read, write, program and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by static random access memory (SRAM) or dynamic random access memory (DRAM). The memory 144 may be disposed within or out of the controller 130. FIG. 1 exemplifies the memory 144 disposed within the controller 130. In an embodiment, the memory 144 may be embodied by an external volatile memory having a memory interface transferring data between the memory 144 and the controller 130.

The processor 134 may control the various operations of the memory system 110. The processor 134 may drive firmware to control the various operations of the memory system 110. The firmware may be referred to as flash translation layer (FTL).

The processor 134 of the controller 130 may include a management unit (not illustrated) for performing a bad management operation of the memory device 150. The management unit may perform a bad block management operation of checking a bad block, in which a program fail occurs due to the characteristics of the memory device (e.g., the characteristics of a NAND flash memory) during a program operation, among the plurality of memory blocks 152 to 156 included in the memory device 150. The management unit may write the program-failed data of the bad block to a new memory block. In the memory device 150 having a 3D stack structure, the bad block management operation may reduce the use efficiency of the memory device 150 and the reliability of the memory system 110. Thus, the bad block management operation needs to be performed with more reliability.

Figure 2:
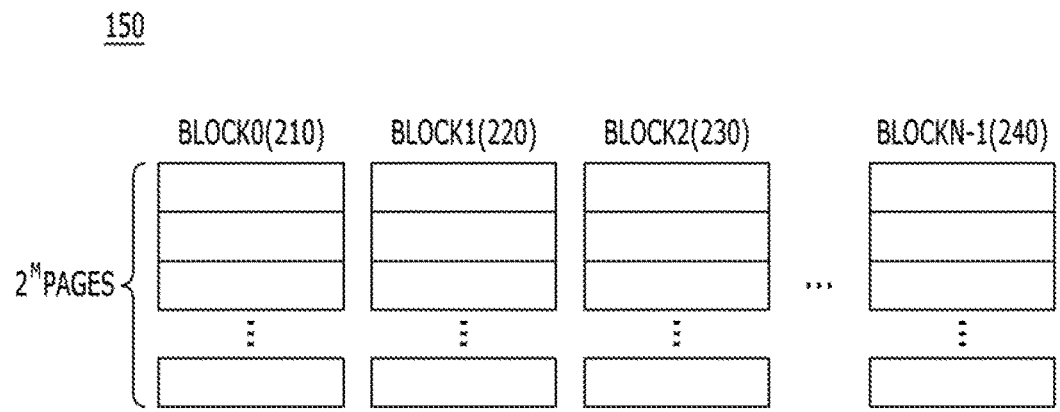
FIG. 2 is a schematic diagram illustrating an exemplary configuration of a memory device employed in the memory system shown in FIG. 1.

FIG. 2 is a schematic diagram illustrating the memory device 150.

Referring to FIG. 2, the memory device 150 may include a plurality of memory blocks 0 to N−1, and each of the blocks 0 to N−1 may include a plurality of pages, for example, $2^M$ pages, the number of which may vary according to circuit design. Memory cells included in the respective memory blocks 0 to N−1 may be one or more of a single level cell (SLC) storing 1-bit data, or a multi-level cell (MLC) storing 2- or more bit data. An MLC storing 3-bit data is also referred to as a triple level cell (TLC), and an MLC storing 4-bit data is also referred to as a quadruple level cell (QLC).

Figure 3:
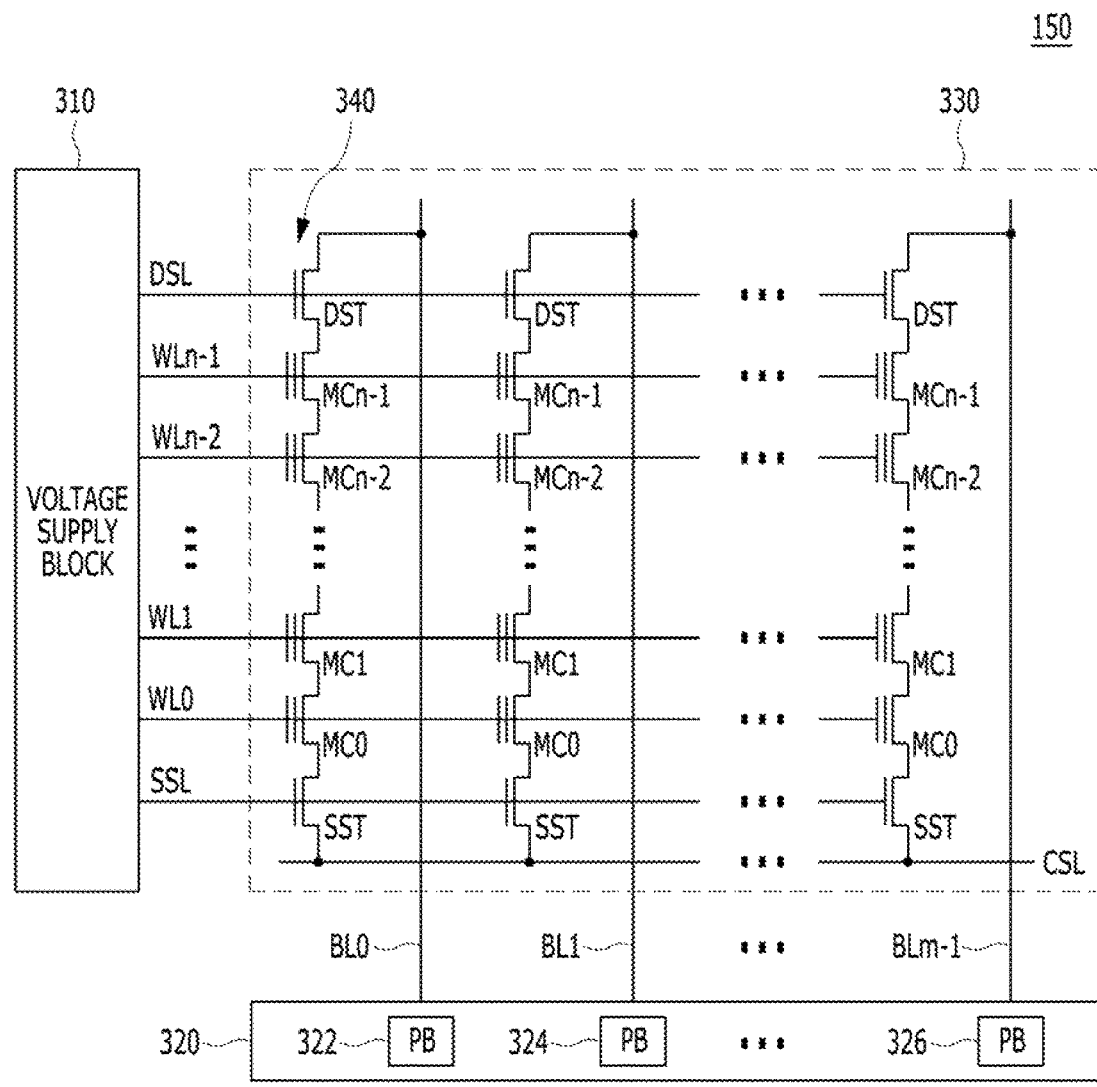
FIG. 3 is a circuit diagram illustrating an exemplary configuration of a memory cell array of a memory block in a memory device shown in FIG. 1.

FIG. 3 is a circuit diagram illustrating an exemplary configuration of a memory cell array of a memory block in the memory device 150.

Referring to FIG. 3, a memory block 330 which may correspond to any of the plurality of memory blocks 152 to 156 included in the memory device 150 of the memory system 110 may include a plurality of cell strings 340 coupled to a plurality of corresponding bit lines BL0 to BLm−1. The cell string 340 of each column may include one or more drain select transistors DST and one or more source select transistors SST. Between the drain and source select transistors DST and SST, a plurality of memory cells MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as Illustrated in FIG. 3, the first cell string is coupled to the first bit line BL0, and the last cell string is coupled to the last bit line BLm−1.

Although FIG. 3 illustrates NAND flash memory cells, the invention is not limited in this way. It is noted that the memory cells may be NOR flash memory cells, or hybrid flash memory cells including two or more kinds of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply unit 310 which provides word line voltages including a program voltage, a read voltage and a pass voltage to supply to the word lines according to an operation mode. The voltage generation operation of the voltage supply unit 310 may be controlled by a control circuit (not illustrated). Under the control of the control circuit, the voltage supply unit 310 may select one of the memory blocks (or sectors) of the memory cell array, select one of the word lines of the selected memory block, and provide the word line voltages to the selected word line and the unselected word lines as may be needed.

The memory device 150 may include a read/write circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Figure 4:
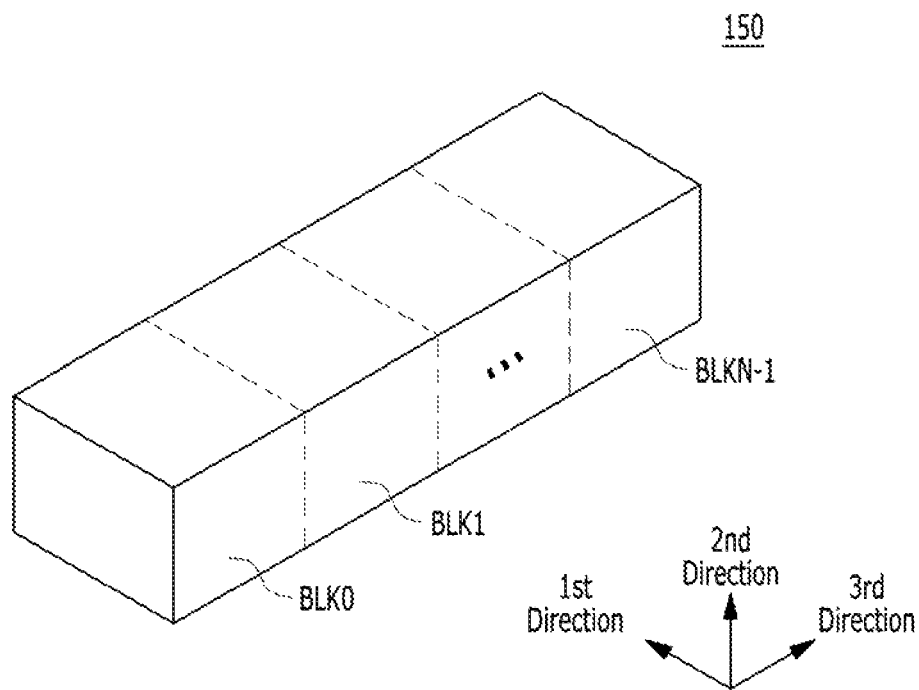
FIG. 4 is a schematic diagram illustrating an exemplary 3-D structure of the memory device shown in FIG. 1.

FIG. 4 is a schematic diagram illustrating an exemplary 3D structure of the memory device 150.

The memory device 150 may be embodied by a 2D or 3D memory device. Specifically, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN−1, each of the memory blocks having a 3D structure (or vertical structure).

Described below in detail will be the translation unit 136 and an operation thereof for efficiently using the memory 144 of the controller 130.

Figure 5:
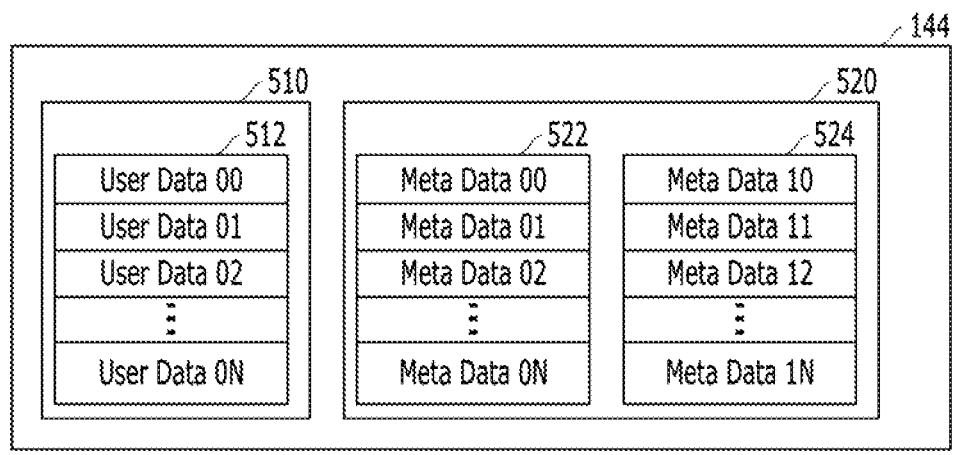
FIG. 5 is a schematic diagram illustrating an example of a memory of a controller according to the prior art.

FIG. 5 is a schematic diagram illustrating an example of the memory 144 of the controller 130 according to the prior art.

Figures 6, 7:
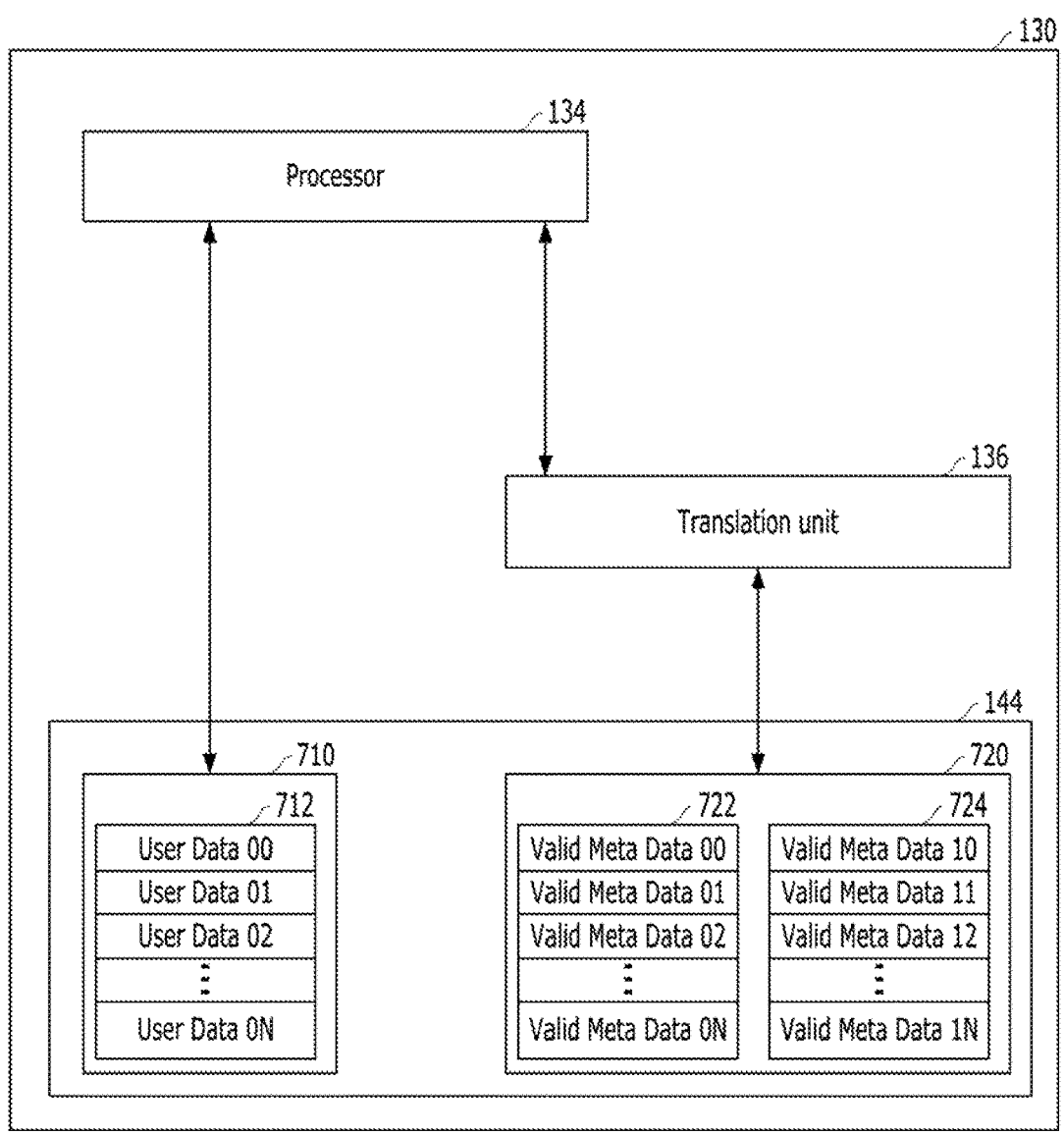
FIG. 6 is a schematic diagram illustrating an example of meta-data stored in the memory according to the prior art.
FIG. 7 is a schematic diagram illustrating a data processing operation of a processor, a translation unit and a memory of a controller shown in FIG. 1 in accordance with an embodiment of the present invention.

FIG. 6 is a schematic diagram illustrating an example of meta-data stored in a memory according to the prior art.

Referring to FIG. 5, the memory 144 of the controller 130 includes a user data region 510 and a meta-data region 520. The user data region 510 stores user data User Data 00 to User Data 0N, and the meta-data region 520 stores meta-data Meta Data 00 to Meta Data 0N and Meta Data 10 to Meta Data 1N. In this disclosure, the meta-data may be all data except for the user data. For example, for example, the meta-data may include map data representing a mapping relationship between logical addresses and physical addresses of the user data in a plurality of memory blocks 152, 154 and 156 of the memory device 150. Further, for example, the meta-data may include super memory block data representing information of grouped memory blocks, which can be simultaneously selected among the memory blocks 152, 154 and 156.

The memory 144 of the controller 130 groups related meta-data among the meta-data Meta Data 00 to Meta Data 0N and Meta Data 10 to Meta Data 1N, and stores the grouped meta-data in a table. That is, referring to FIG. 5, among the meta-data Meta Data 00 to Meta Data 0N and Meta Data 10 to Meta Data 1N, the memory 144 of the controller 130 may store meta-data Meta Data 00 to Meta Data 0N in a first meta-table 522, and stores meta-data Meta Data 10 to Meta Data 1N in a second meta table 524. The first meta-table 522 may be a map table storing map data, and the second meta-table 524 may be a super memory block table storing super memory block data.

In general, the meta-data Meta Data 00 to Meta Data 0N and Meta Data 10 to Meta Data 1N may be stored by units of proper size (e.g., 2 or 4 bytes), which the processor 134 can process, in the memory 144 of the controller 130. Each unit of the meta-data includes valid meta-data and dummy data. For example, when the processor 134 can process data of 2 bytes (i.e., 16 bits) and the valid meta-data of the respective meta-data Meta Data 00 to Meta Data 0N and Meta Data 10 to Meta Data 1N is 10 bits, the memory 144 of the controller 130 stores the meta-data Meta Data 00 to Meta Data 0N and Meta Data 10 to Meta Data 1N of 16 bits comprising the valid meta-data of 10 bits and the dummy data of 6 bits. The valid meta-data is of bits used for representing meta-information of the meta-data, and the dummy data is of bits used for adjusting size of the meta-data units, which can be processed by the processor 134. Therefore, the dummy data do not represent meta-information of the meta-data.

FIG. 6 exemplifies that $1^{st}$ to $4^{th}$ meta-data are stored in meta-table 610, the valid meta-data of the respective $1^{st}$ to $4^{th}$ meta-data is of 10 bits and the dummy data of the respective $1^{st}$ to $4^{th}$ meta-data is of 6 bits. In detail, $1^{st}$ meta-data is stored in $1^{st}$ to $16^{th}$ columns C0 to C15 of a $1^{st}$ row R0 in the meta-table 610, the valid meta-data of the $1^{st}$ meta-data is stored in the $1^{st}$ to $10^{th}$ columns C0 to C9 of the $1^{st}$ row R0, and the dummy data of the $1^{st}$ meta-data is stored in the $11^{th}$ to $16^{th}$ columns C10 to C15 of the $1^{st}$ row R0. In similar way, $2^{nd}$ to $4^{th}$ meta-data are stored in $2^{nd}$ to $4^{th}$ rows R1 to R3 of the meta-table 610.

Referring to FIG. 6, since the valid meta-data is of 10 bits and the dummy data is of 6 bits in the respective $1^{st}$ to $4^{th}$ meta-data, 40 bits (i.e., the valid meta-data*4) represent the meta-information but 24 bits (i.e., the dummy data*4) do not represent the meta-information in the meta-table 610 of 64 bits (i.e., 8 bytes). Accordingly, as exemplified in FIG. 6, about 37.5% (=24 bits/64 bits*100%) of storage space in the meta-table 610 is filled with the dummy data. That is, the storage space of the memory 144 of the controller 130 is not efficiently utilized.

Described below in detail with reference to FIGS. 7 to 10 will be a translation unit 136, which is further included in the controller 130, and an operation thereof for more efficiently using the memory 144 of the controller 130.

FIG. 7 is a schematic diagram illustrating a data processing operation of the processor 134, the translation unit 136 and the memory 144 of the controller 130 in accordance with an embodiment of the present invention.

Figure 8:
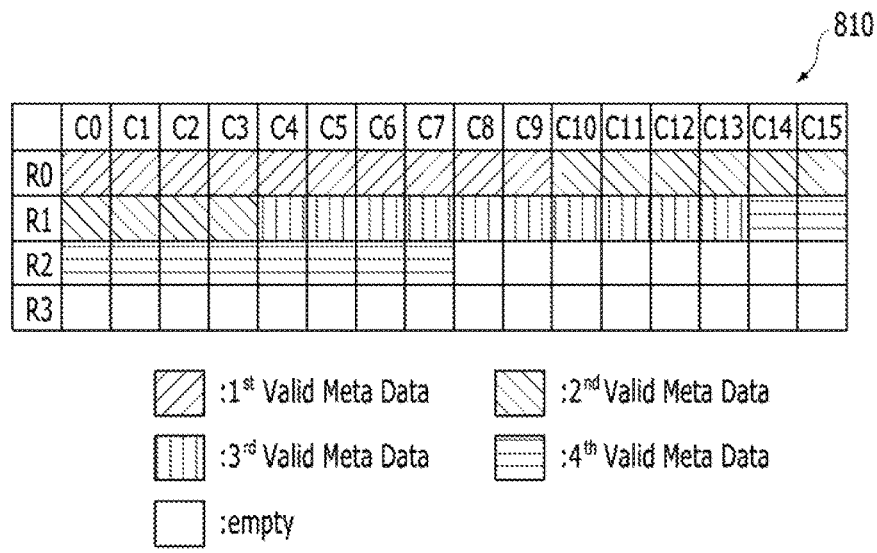
FIG. 8 is a schematic diagram illustrating meta-data stored in the memory in accordance with an embodiment of the present invention.

FIG. 8 is a schematic diagram illustrating meta-data stored in the memory 144 in accordance with an embodiment of the present invention.

Figure 9:
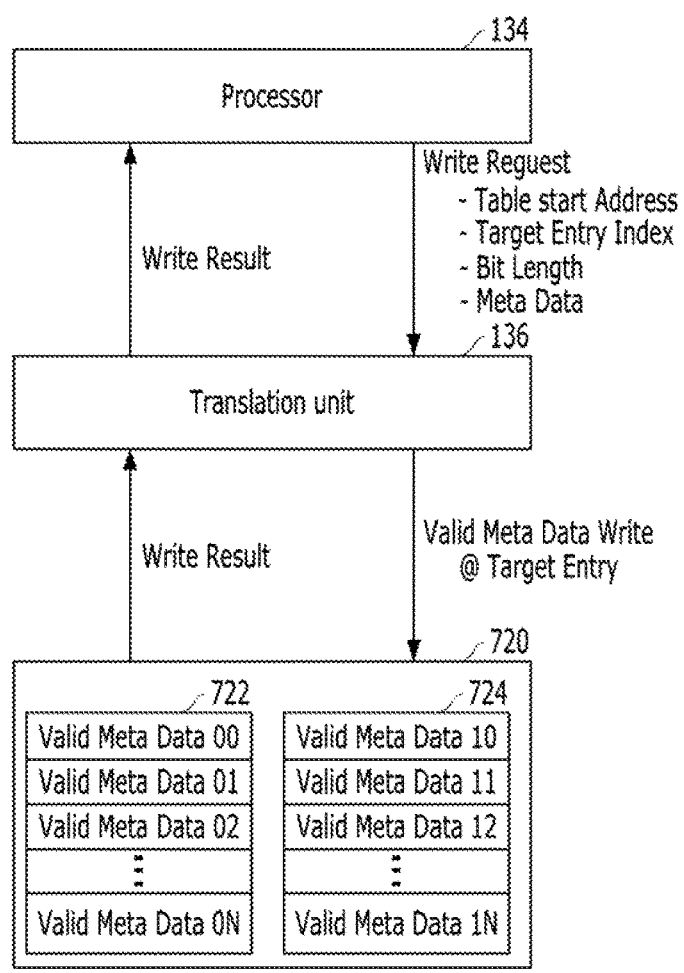
FIG. 9 is a schematic diagram illustrating a meta-data processing operation of the processor, the translation unit and the memory of the controller shown in FIG. 1 in accordance with an embodiment of the present invention.

FIG. 9 is a schematic diagram illustrating a meta-data processing operation of the processor 134, the translation unit 136 and the memory 144 of the controller 130 in accordance with an embodiment of the present invention.

Figure 10:
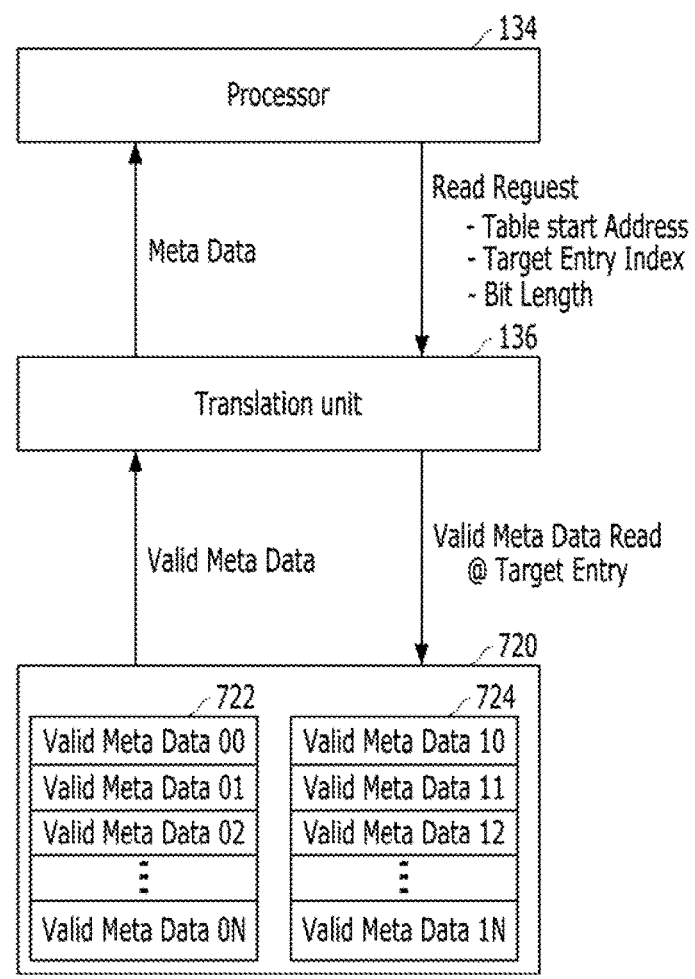
FIG. 10 is a schematic diagram illustrating a meta-data processing operation of the processor, the translation unit and the memory of the controller shown in FIG. 1 in accordance with an embodiment of the present invention.

FIG. 10 is a schematic diagram illustrating a meta-data processing operation of the processor 134, the translation unit 136 and the memory 144 of the controller 130 in accordance with an embodiment of the present invention.

As exemplified in FIG. 7, the processor 134 may access the memory 144 to read and/or write data, and the processor 134 may access the memory 144 directly or indirectly through the translation unit 136 according to the type of data to be read from and/or written into the memory 144.

In detail, the processor 134 may directly access the memory 144 when the processor 134 access a user data region 710 of the memory 144 to read and/or write the user data User Data 00 to User Data 0N, and the processor 134 may indirectly access the memory 144 through the translation unit 136 when the processor 134 access a meta-data region 720 of the memory 144 to read and/or write the meta-data Meta Data 00 to Meta Data 0N and Meta Data 10 to Meta Data 1N.

In response to a write request from the processor 134, the translation unit 136 may store valid meta-data Valid Meta Data 00 to Valid Meta Data 0N and Valid Meta Data 10 to Valid Meta Data 1N of the meta-data Meta Data 00 to Meta Data 0N and Meta Data 10 to Meta Data 1N provided from the processor 134 into the memory 144. In response to a read request from the processor 134, the translation unit 136 may change valid meta-data Valid Meta Data 00 to Valid Meta Data 0N and Valid Meta Data 10 to Valid Meta Data 1N into the meta-data Meta Data 00 to Meta Data 0N and Meta Data 10 to Meta Data 1N stored in the memory 144, and then provide the processor 134 with the changed meta-data Meta Data 00 to Meta Data 0N and Meta Data 10 to Meta Data 1N.

For example, when the translation unit 136 receives from the processor 134 a write request to store $1^{st}$ to $4^{th}$ meta-data each having the valid meta-data of 10 bits and dummy data of 6 bits, the translation unit 136 may store the $1^{st}$ to $4^{th}$ valid meta-data each having 10 bits into a meta-table 810 of 64 bits (i.e., 8 bytes) provided in the memory 144, as exemplified in FIG. 8. In detail, the translation unit 136 may store a valid meta-data of the $1^{st}$ meta-data into $1^{st}$ to $10^{th}$ columns C0 to C9 of a $1^{st}$ row R0 in the meta-table 810, a valid meta-data of the $2^{nd}$ meta-data into $11^{th}$ to $16^{th}$ columns C10 to C15 of the $1^{st}$ row R0 and $1^{st}$ to $4^{th}$ columns C0 to C3 of a $2^{nd}$ row R1 In the meta-table 810, a valid meta-data of the $3^{rd}$ meta-data into $5^{th}$ to $14^{th}$ columns C4 to C13 of the $2^{nd}$ row R1 in the meta-table 810, and a valid meta-data of the $4^{th}$ meta-data into $15^{th}$ to $16^{th}$ columns C14 to C15 of the $2^{nd}$ row R1 and $1^{st}$ to $8^{th}$ columns C0 to C7 of a $3^{rd}$ row R2 in the meta-table 810. Accordingly, storage space of 24 bits may be secured in the meta-table 810, and the memory 144 of the controller 130 may additionally store 2 valid meta-data into the secured 24-bit storage space. In accordance with an embodiment of the present invention, storage space of the memory 144 of the controller 130 may be utilized more efficiently.

Further, for example, when the translation unit 136 receives from the processor 134 a read request to store $2^{nd}$ meta-data having the valid meta-data of 10 bits and dummy data of 6 bits, the translation unit 136 may read a $2^{nd}$ valid meta-data of 10 bits stored in the meta-table 810 of 64 bits (i.e., 8 bytes) provided in the memory 144, add a dummy data of 6 bits into the $2^{nd}$ valid meta-data of 10 bits, and provide the $2^{nd}$ valid meta-data and the dummy data to the processor 134.

FIG. 9 illustrates a write operation of the translation unit 136 writing the valid meta-data Valid Meta Data 00 to Valid Meta Data 0N and Valid Meta Data 10 to Valid Meta Data 1N into the memory 144 in response to a write request from the processor 134. That is, FIG. 9 illustrates that the processor 134 indirectly accesses the memory 144 through the translation unit 136 to store the meta-data Meta Data 00 to Meta Data 0N and Meta Data 10 to Meta Data 1N into the memory 144.

First, the processor 134 may provide the translation unit 136 with a write request to store meta-data into the memory 144. As Illustrated in FIG. 9, the write request may include a start address of a meta-table (i.e., table start address), location of a target entry (i.e., target entry index), a bit-length of the valid meta-data and meta-data (i.e., valid meta-data and dummy data). The start address of the meta-table (i.e., table start address) may represent a start address of the meta-tables 722 and 724 in the meta-data region 720 of the memory 144. The location of a target entry (i.e., target entry index) may be addresses of a valid meta-data of a meta-data in the meta-tables 722 and 724 to store the valid meta-data of the meta-data in response to a write request. The target entry may represent a region of the meta-tables 722 and 724 to store a valid meta-data, and may have the same size as the valid meta-data.

Then, translation unit 136 may store the provided valid meta-data into the target entry of the memory 144 in response to the write request of the processor 134. That is, the translation unit 136 may obtain the valid meta-data of the meta-data provided from the processor 134 by referring to the bit-length of the valid meta-data, and may store the obtained valid meta-data into the target entry of the meta-tables 722 and 724. For example, when the write request includes a start address of the first meta-table 722 as a start address of a meta-table, "2" as location of a target entry, 10 bits as a bit-length of the valid meta-data, and 16 bits as a meta-data, the translation unit 136 may obtain the valid meta-data of 10 bits from the meta-data of 16 bits, and may store the obtained valid meta-data into a $2^{nd}$ entry of the $1^{st}$ meta-table 722. Accordingly, the $2^{nd}$ valid meta-data Valid Meta Data 01 may be stored in the $2^{nd}$ entry of the $1^{st}$ meta-table 722 in the memory 144.

Next, as exemplified in FIG. 9, the memory 144 may provide the translation unit 136 with a storage result message (i.e., storage completion message) and the translation unit 136 may provide the processor 134 with the storage result message (i.e., storage completion message), and therefore, the write operation that the processor 134 indirectly access the memory 144 through the translation unit 136 to write the valid meta-data Valid Meta Data 00 to Valid Meta Data 0N and Valid Meta Data 10 to Valid Meta Data 1N may end.

As described above, the translation unit 136 of the controller 130 may store only the valid meta-data Valid Meta Data 00 to Valid Meta Data 0N and Valid Meta Data 10 to Valid Meta Data 1N of the meta-data Meta Data 00 to Meta Data 0N and Meta Data 10 to Meta Data 1N Into the memory 144 thereby efficiently utilizing the storage space in the memory 144 of the controller 130.

FIG. 10 illustrates a read operation of the translation unit 136 reading the valid meta-data Valid Meta Data 00 to Valid Meta Data 0N and Valid Meta Data 10 to Valid Meta Data 1N stored in the memory 144, adding the dummy data to the valid meta-data Valid Meta Data 00 to Valid Meta Data 0N and Valid Meta Data 10 to Valid Meta Data 1N and then providing the processor 134 with the valid meta-data Valid Meta Data 00 to Valid Meta Data 0N and Valid Meta Data 10 to Valid Meta Data 1N and the added dummy data in response to a read request of the processor 134. That is, FIG. 10 illustrates that the processor 134 indirectly accesses the memory 144 through the translation unit 136 to read the meta-data Meta Data 00 to Meta Data 0N and Meta Data 10 to Meta Data 1N.

First, the processor 134 may provide the translation unit 136 with a read request to read the meta-data Meta Data 00 to Meta Data 0N and Meta Data 10 to Meta Data 1N from the memory 144. As exemplified in FIG. 10, the read request may include a start address of a meta-table, location of a target entry and a bit-length of the valid meta-data.

Then, translation unit 136 may read the valid meta-data Valid Meta Data 00 to Valid Meta Data 0N and Valid Meta Data 10 to Valid Meta Data 1N stored in the target entry of the memory 144 in response to the read request. That is, the translation unit 136 may read the valid meta-data Valid Meta Data 00 to Valid Meta Data 0N and Valid Meta Data 10 to Valid Meta Data 1N stored in the target entry of the memory 144 by referring to the bit-length of the valid meta-data. For example, when the read request includes a start address of the $1^{st}$ meta-table 722 as a start address of a meta-table, "2" as location of a target entry and 10 bits as a bit-length of the valid meta-data, the translation unit 136 may read the valid meta-data of 10 bits stored in the $2^{nd}$ entry of the $1^{st}$ meta-table 722. Accordingly, the translation unit 136 may read the $2^{nd}$ valid meta-data Valid Meta Data 01 stored in the $2^{nd}$ entry of the $1^{st}$ meta-table 722 of the memory 144.

Next, the translation unit 136 may generate the meta-data Meta Data 00 to Meta Data 0N and Meta Data 10 to Meta Data 1N by adding the dummy data of predetermined length to the read valid meta-data Valid Meta Data 00 to Valid Meta Data 0N and Valid Meta Data 10 to Valid Meta Data 1N, and provide the processor 134 with the generated meta-data Meta Data 00 to Meta Data 0N and Meta Data 10 to Meta Data 1N. The bit-length of the dummy data may be predetermined according to the meta-data Meta Data 00 to Meta Data 0N and Meta Data 10 to Meta Data 1N. For example, when the meta-data Meta Data 00 to Meta Data 0N and Meta Data 10 to Meta Data 1N comprise the valid meta-data Valid Meta Data 00 to Valid Meta Data 0N and Valid Meta Data 10 to Valid Meta Data 1N of 13 bits and the dummy data of 3 bits, the translation unit 136 may generate the meta-data Meta Data 00 to Meta Data 0N and Meta Data 10 to Meta Data 1N by adding the dummy data of 3 bits to the read valid meta-data Valid Meta Data 00 to Valid Meta Data 0N and Valid Meta Data 10 to Valid Meta Data 1N of 13 bits. For example, when the meta-data Meta Data 00 to Meta Data 0N and Meta Data 10 to Meta Data 1N comprise the valid meta-data Valid Meta Data 00 to Valid Meta Data 0N and Valid Meta Data 10 to Valid Meta Data 1N of 12 bits and the dummy data of 4 bits, the translation unit 126 may generate the meta-data Meta Data 00 to Meta Data 0N and Meta Data 10 to Meta Data 1N by adding the dummy data of 4 bits to the read valid meta-data Valid Meta Data 00 to Valid Meta Data 0N and Valid Meta Data 10 to Valid Meta Data 1N of 12 bits.

The translation unit 136 provide the processor 134 with the meta-data Meta Data 00 to Meta Data 0N and Meta Data 10 to Meta Data 1N made through adding the dummy data of the predetermined length to the read valid meta-data Valid Meta Data 00 to Valid Meta Data 0N and Valid Meta Data 10 to Valid Meta Data 1N in response to the read request, and thus read operation that the processor 134 indirectly accesses the memory 144 through the translation unit 136 to read the valid meta-data Valid Meta Data 00 to Valid Meta Data 0N and Valid Meta Data 10 to Valid Meta Data 1N may end.

As described above, the translation unit 136 of the controller 130 may store only the valid meta-data Valid Meta Data 00 to Valid Meta Data 0N and Valid Meta Data 10 to Valid Meta Data 1N of the meta-data Meta Data 00 to Meta Data 0N and Meta Data 10 to Meta Data 1N into the memory 144 thereby efficiently utilizing the storage space in the memory 144 of the controller 130.

Although it is described in this disclosure that the translation unit 136 of the controller 130 may store only the valid meta-data Valid Meta Data 00 to Valid Meta Data 0N and Valid Meta Data 10 to Valid Meta Data 1N of the meta-data Meta Data 00 to Meta Data 0N and Meta Data 10 to Meta Data 1N into the memory 144, the valid meta-data Valid Meta Data 00 to Valid Meta Data 0N and Valid Meta Data 10 to Valid Meta Data 1N may be stored in the plurality of memory blocks 152, 154 and 156 of the memory device 150 as well as the memory 144, and thereby efficiently utilizing the storage space in the memory device 150.

FIGS. 11 to 16 are schematic diagrams illustrating application examples of the data processing system of FIG. 1.

Figure 11:
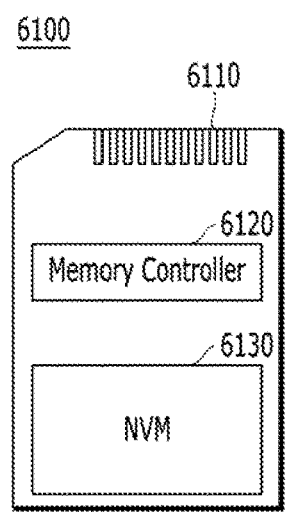
FIGS. 11 to 16 are schematic diagrams illustrating application examples of the data processing system shown in FIG. 1.

FIG. 11 is a diagram schematically illustrating another example of the data processing system including the memory system in accordance with the present embodiment. FIG. 11 schematically illustrates a memory card to which the memory system in accordance with the present embodiment is applied.

Referring to FIG. 11, the memory card 6100 may include a memory controller 6120, a memory device 6130 and a connector 6110.

More specifically, the memory controller 6120 may be connected to the memory device 6130 embodied by a nonvolatile memory, and configured to access the memory device 6130. For example, the memory controller 6120 may be configured to control read, write, erase and background operations of the memory device 6130. The memory controller 6120 may be configured to provide an interface between the memory device 6130 and a host, and drive firmware for controlling the memory device 6130. That is, the memory controller 6120 may correspond to the controller 130 of the memory system 110 described with reference to FIGS. 1 to 10, and the memory device 6130 may correspond to the memory device 150 of the memory system 110 described with reference to FIGS. 1 to 10.

Thus, the memory controller 6120 may include a RAM, a processing unit, a host interface, a memory interface and an error correction unit. The memory controller 130 may further include the elements shown in FIG. 7 and perform the operations described in reference to FIGS. 7 to 10.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system in accordance with the present embodiment may be applied to wired/wireless electronic devices or particularly mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM). The memory device 6130 may include a plurality of dies as in the memory device 150 of FIG. 1.

The memory controller 6120 and the memory device 6130 may be integrated into a single semiconductor device. For example, the memory controller 6120 and the memory device 6130 may construct a solid-state driver (SSD) by being integrated into a single semiconductor device. Also, the memory controller 6120 and the memory device 6130 may construct a memory card such as a PC card (PCMCIA: Personal Computer Memory Card International Association), a compact flash (CF) card, a smart media card (e.g., SM and SMC), a memory stick, a multimedia card (e.g., MMC, RS-MMC, MMCmicro and eMMC), an SD card (e.g., SD, miniSD, microSD and SDHC) and a universal flash storage (UFS).

Figure 12:
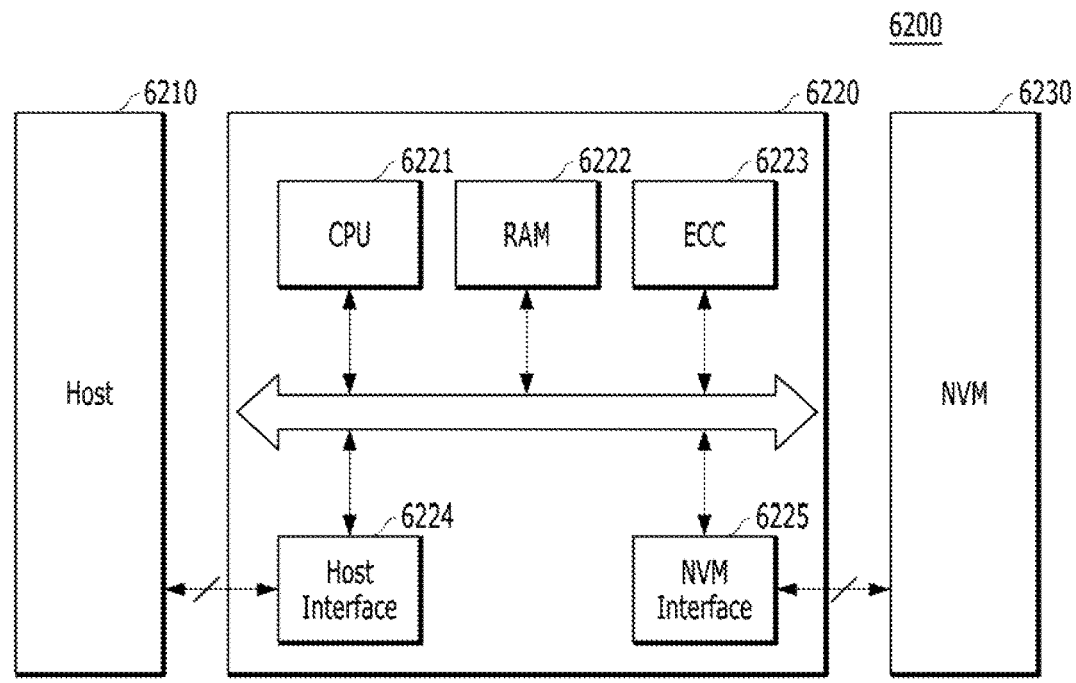

FIG. 12 is a diagram schematically illustrating another example of the data processing system including the memory system in accordance with the present embodiment.

Referring to FIG. 12, the data processing system 6200 may include a memory device 6230 having one or more nonvolatile memories and a memory controller 6220 for controlling the memory device 6230. The data processing system 6200 illustrated in FIG. 12 may serve as a storage medium such as a memory card (CF, SD, micro-SD or the like) or USB device, as described with reference to FIG. 1. The memory device 6230 may correspond to the memory device 150 in the memory system 110 illustrated in FIGS. 1 to 10, and the memory controller 6220 may correspond to the controller 130 in the memory system 110 illustrated in FIGS. 1 to 10.

The memory controller 6220 may control a read, write or erase operation on the memory device 6230 in response to a request of the host 6210, and the memory controller 6220 may include one or more CPUs 6221, a buffer memory such as RAM 6222, an ECC circuit 6223, a host interface 6224 and a memory interface such as an NVM interface 6225.

The CPU 6221 may control the various operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC unit 138 of the controller 130 illustrated in FIG. 1. As described with reference to FIG. 1, the ECC circuit 6223 may generate an error correction code (ECC) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. At this time, the ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may transmit/receive data to/from the host 6210 through the host interface 6224, and transmit/receive data to/from the memory device 6230 through the NVM interface 6225. The host interface 6224 may be connected to the host 6210 through a PATA bus, SATA bus, SCSI, USB, PCIe or NAND interface. The memory controller 6220 may have a wireless communication function with a mobile communication protocol such as WiFi or Long Term Evolution (LTE). The memory controller 6220 may be connected to an external device, for example, the host 6210 or another external device, and then transmit/receive data to/from the external device. In particular, as the memory controller 6220 is configured to communicate with the external device through one or more of various communication protocols, the memory system and the data processing system in accordance with the present embodiment may be applied to wired/wireless electronic devices or particularly a mobile electronic device.

Figure 13:
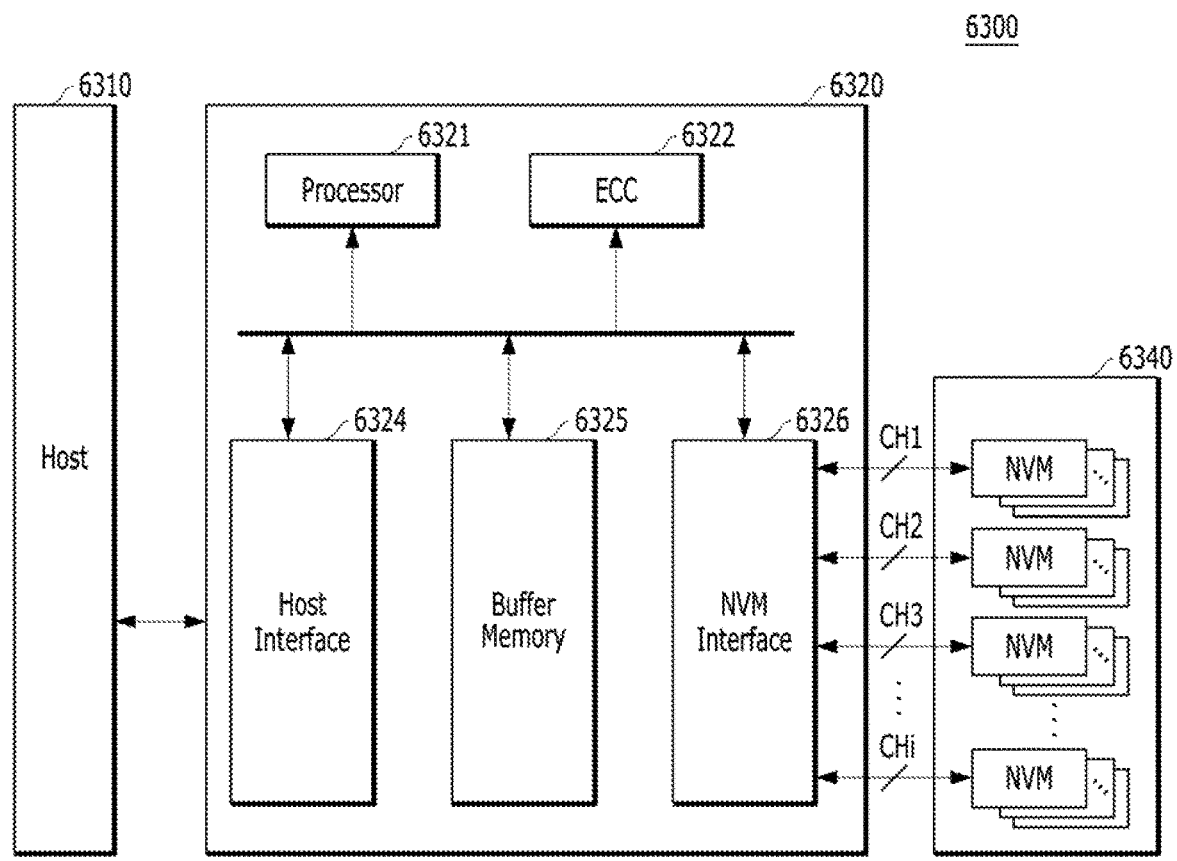

FIG. 13 is a diagram schematically illustrating another example of the data processing system including the memory system in accordance with the present embodiment. FIG. 13 schematically illustrates an SSD to which the memory system in accordance with the present embodiment is applied.

Referring to FIG. 13, the SSD 6300 may include a controller 6320 and a memory device 6340 including a plurality of nonvolatile memories. The controller 6320 may correspond to the controller 130 in the memory system 110 of FIGS. 1 to 10, and the memory device 6340 may correspond to the memory device 150 in the memory system of FIGS. 1 to 10.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM Included in the memory device 6340, or temporarily store meta data of the plurality of flash memories NVM, for example, map data including a mapping table. The buffer memory 6325 may be embodied by volatile memories such as DRAM, SDRAM, DDR SDRAM, LPDDR SDRAM and GRAM or nonvolatile memories such as FRAM, ReRAM, STT-MRAM and PRAM. For convenience of description, FIG. 12 illustrates that the buffer memory 6325 exists in the controller 6320. However, the buffer memory 6325 may exist outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIGS. 1 to 10 is applied may be provided to embody a data processing system, for example, RAID (Redundant Array of Independent Disks) system. At this time, the RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 14:
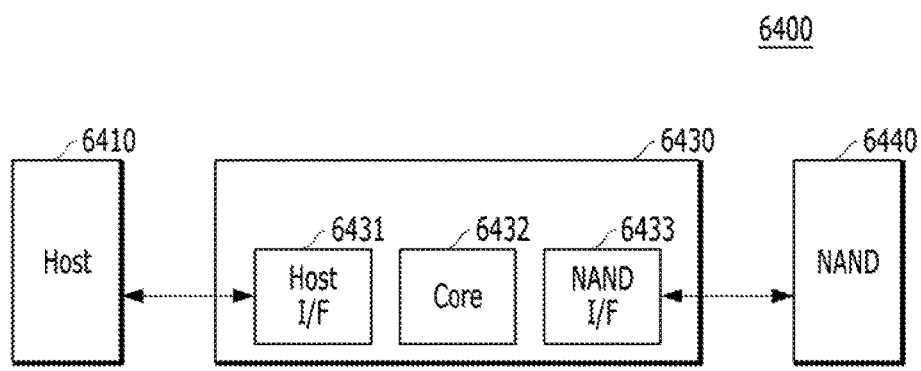
Figure 16:
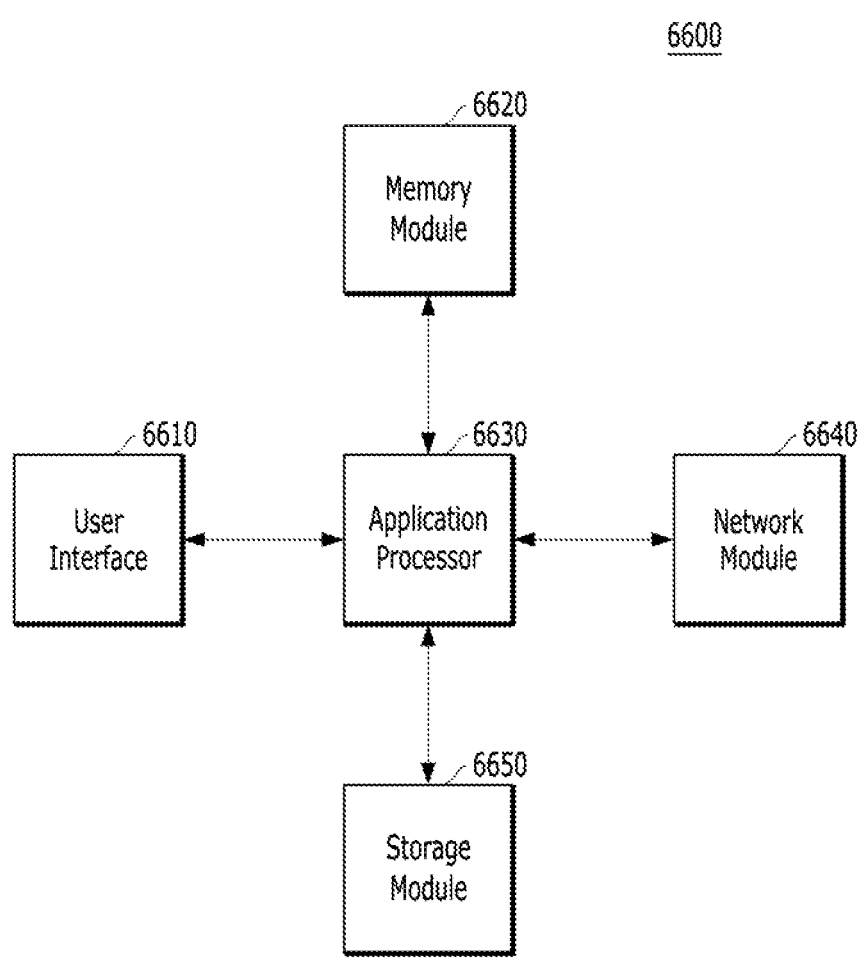

FIG. 14 is a diagram schematically illustrating another example of the data processing system including the memory system in accordance with the present embodiment. FIG. 16 schematically illustrates an embedded Multi-Media Card (eMMC) to which the memory system in accordance with the present embodiment is applied.

Referring to FIG. 14, the eMMC 6400 may include a controller 6430 and a memory device 6440 embodied by one or more NAND flash memories. The controller 6430 may correspond to the controller 130 in the memory system 110 of FIGS. 1 to 10, and the memory device 6440 may correspond to the memory device 150 in the memory system 110 of FIGS. 1 to 10.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control various operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, Ultra High Speed (UHS-I/UHS-II) interface.

Figure 15:
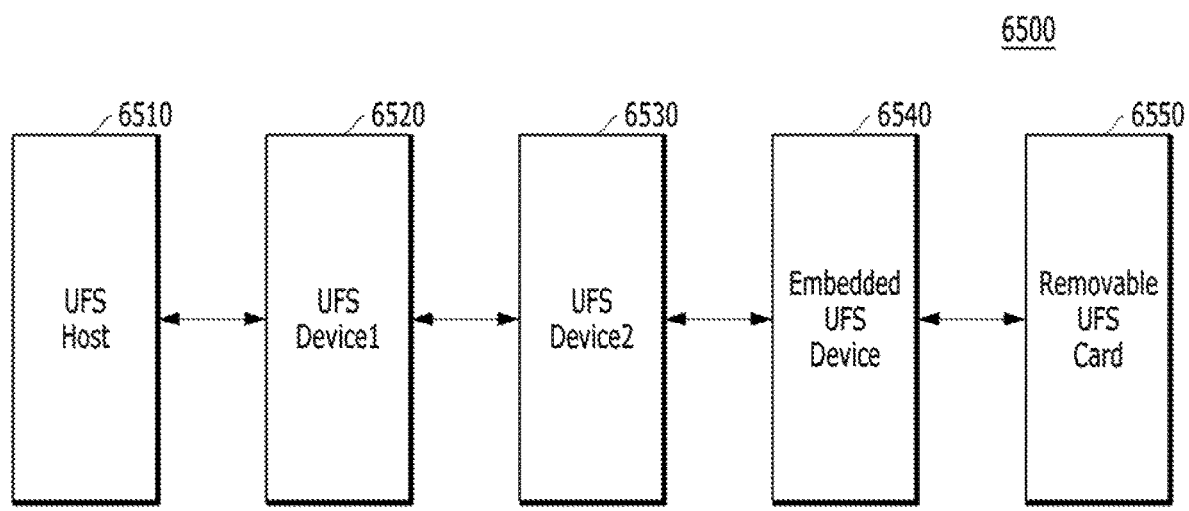

FIG. 15 is a diagram illustrating another example of a data processing system including a memory system according to an embodiment of the present invention. FIG. 15 illustrates a universal flash storage (UFS) to which the memory system according to an embodiment is applied.

Referring to FIG. 15, a UFS system 6500 may include a UFS host 6510, a plurality of UFS devices 6520 and 6530, an embedded UFS device 6540, and a removable UFS card 6550. The UFS host 6510 may be an application processor of wired/wireless electronic appliances, for example, a mobile electronic appliance.

The UFS host 6510, the UFS devices 6520 and 6530, the embedded UFS device 6540 and the removable UFS card 6550 may respectively communicate with external devices such as wired/wireless electronic appliances (for example, a mobile electronic appliance), through a UFS protocol. The UFS devices 6520 and 6530, the embedded UFS device 6540 and the removable UFS card 6550 may be implemented with the memory system 110 described above with reference to FIG. 1, for example, as the memory card system 6100 described above with reference to FIG. 11. The embedded UFS device 6540 and the removable UFS card 6550 may communicate through another protocol other than the UFS protocol. For example, the embedded UFS device 6540 and the removable UFS card 6550 may communicate through various card protocols such as, but not limited to, USB flash drives (UFDs), multimedia card (MMC), secure digital (SD), mini SD and Micro SD.

FIG. 16 is a diagram illustrating an example of a data processing system including the memory system according to an embodiment of the present invention. FIG. 16 illustrates a user system to which the memory system according to an embodiment is applied.

Referring to FIG. 16, a user system 6600 may include an application processor 6630, a memory module 6620, a network module 6640, a storage module 6650, and a user interface 6610.

The application processor 6630 may drive components included in the user system 6600 and an operating system (OS). For example, the application processor 6630 may include controllers for controlling the components included in the user system 6600, interfaces, graphics engines, and so on. The application processor 6630 may be provided by a system-on-chip (SoC).

The memory module 6620 may operate as a main memory, a working memory, a buffer memory or a cache memory of the user system 6600. The memory module 6620 may include a volatile random access memory such as a dynamic random access memory (DRAM), a synchronous dynamic random access memory (SDRAM), a double data rate (DDR) SDRAM, a DDR2 SDRAM, a DDR3 SDRAM, a low power double data rate (LPDDR) SDRAM, an LPDDR2 SDRAM and an LPDDR3 SDRAM or a nonvolatile random access memory such as a phase change random access memory (PRAM), a resistive random access memory (ReRAM), a magnetic random access memory (MRAM) and a ferroelectric random access memory (FRAM). For example, the application processor 6630 and the memory module 6620 may be mounted by being packaged on the basis of a package-on-package (POP).

The network module 6640 may communicate with external devices. For example, the network module 6640 may support not only wired communications but also various wireless communications such as code division multiple access (CDMA), global system for mobile communication (GSM), wideband CDMA (WCDMA), CDMA-2000, time division multiple access (TDMA), long term evolution (LTE), worldwide interoperability for microwave access (WIMAX), wireless local area network (WLAN), ultra-wideband (UWB), Bluetooth, wireless display (WI-DI), and so on, and may thereby communicate with wired/wireless electronic appliances. For example, a mobile electronic appliance. According to this fact, the memory system and the data processing system according to an embodiment may be applied to wired/wireless electronic appliances. The network module 6640 may be included in the application processor 6630.

The storage module 6650 may store data such as data provided from the application processor 6530, and transmit data stored therein, to the application processor 6530. The storage module 6650 may be realized by a nonvolatile semiconductor memory device such as a phase-change RAM (PRAM), a magnetic RAM (MRAM), a resistive RAM (ReRAM), a NAND flash memory, a NOR flash memory and a 3-dimensional NAND flash memory. The storage module 6650 may be provided as a removable storage medium such as a memory card of the user system 6600 and an external drive. For example, the storage module 6650 may correspond to the memory system 110 described above with reference to FIG. 1, and may be implemented with the SSD, eMMC and UFS described above with reference to FIGS. 13 to 15.

The user interface 6610 may include interfaces for inputting data or commands to the application processor 6630 or for outputting data to an external device. For example, the user interface 6610 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, a light emitting diode (LED), a speaker and a motor.

In the case where the memory system 110 described above with reference to FIG. 1 is applied to the mobile electronic appliance of the user system 6600 according to an embodiment, the application processor 6630 may control the operations of the mobile electronic appliance, and the network module 6640 as a communication module may control wired/wireless communication with an external device, as described above. The user interface 6610 as the display/touch module of the mobile electronic appliance displays data processed by the application processor 6630 or supports input of data from a touch panel.

The memory system and the operating method thereof according to the embodiments may minimize complexity and performance deterioration of the memory system and maximize use efficiency of a memory device, thereby quickly and stably process data with respect to the memory device.

Although various embodiments have been described for illustrative purposes, it will be apparent to those skilled in the art that various changes and modifications may be made without departing from the spirit and scope of the invention as defined in the following claims.

What is claimed is:

1. A controller comprising:
   a memory suitable for storing valid data of meta-data in a first data region and storing user data in a second data region, wherein the meta-data includes the valid data and dummy data;
   a translation unit suitable for performing a first translation operation of changing the meta-data to the valid data by eliminating the dummy data from the meta-data, performing a second translation operation of changing the valid data to the meta-data by adding the dummy data to the valid data, and exchanging the valid data with the memory; and
   a processor suitable for exchanging the meta-data with the translation unit, and exchanging the user data with the memory.

2. The controller of claim 1, wherein the translation unit performs the first translation operation to the meta-data provided from the processor, and stores the valid data, which is changed by the first translation operation, in the memory.

3. The controller of claim 2,
   wherein the processor provides the translation unit with a write request including length information of the valid data and the meta-data, and
   wherein the translation unit performs the first translation operation to the meta-data included in the write request based on the length information of the valid data.

4. The controller of claim 3,
   wherein the write request further includes entry information, and
   wherein the translation unit stores the valid data, which is changed by the first translation operation, in the memory based on the entry information.

5. The controller of claim 4, wherein the entry information includes a start address of the first data region and location of entry in the first data region.

6. The controller of claim 1, wherein the translation unit performs the second translation operation to the valid data read from the memory, and provides the processor with the meta-data, which is changed by the second translation operation.

7. The controller of claim 6,
   wherein the processor provides the translation unit with a read request including entry information and length information of the valid data, and
   wherein the translation unit reads the valid data corresponding to the read request based on the entry information, and performs the second translation operation to the read valid data.

8. The controller of claim 7, wherein the entry information includes a start address of the first data region and location of entry in the first data region.

9. The controller of claim 1, wherein the meta-data represents a mapping relationship between a logical address and a physical address of the user data.

10. An operation method of a controller including a translation unit, the operation method comprising:
    performing, by the translation unit, a first translation operation of changing meta-data, which include valid data and dummy data and is provided from a processor, to the valid data by eliminating the dummy data from the meta-data;
    storing, by the translation unit, the valid data in a first data region of a memory;
    performing, by the translation unit, a second translation operation of changing the valid data, which is read from the first data region of the memory, to the meta-data by adding the dummy data to the valid data; and
    providing, by the translation unit, the meta-data to the processor.

11. The operation method of claim 10, wherein the performing of the first translation operation includes:
    providing, by the processor, the translation unit with a write request including length information of the valid data and the meta-data; and
    performing, by the translation unit, the first translation operation to the meta-data included in the write request based on the length information of the valid data.

12. The operation method of claim 11,
    wherein the write request further includes entry information, and
    wherein the storing of the valid data includes storing, by the translation unit, the valid data, which is changed by the first translation operation, in the first data region of the memory based on the entry information.

13. The operation method of claim 12, wherein the entry information includes a start address of the first data region and location of entry in the first data region.

14. The operation method of claim 10, wherein the performing of the second translation operation includes:
    providing, by the processor, the translation unit with a read request including entry information and length information of the valid data;
    reading, by the translation unit, the valid data corresponding to the read request from the first data region of the memory based on the entry information; and
    performing, by the translation unit, the second translation operation to the read valid data.

15. The operation method of claim 14, wherein the entry information includes a start address of the first data region and location of entry in the first data region.

16. The operation method of claim 10, further comprising storing, by the processor, user data in a second data region of the memory.

17. The operation method of claim 10, wherein the meta-data represents mapping relationship between logical address and physical address of the user data.

18. The operation method of claim 10, wherein the meta-data represents information of grouped memory blocks, which can be simultaneously selected among memory blocks.

* * * * *